United States Patent [19]
Ueda et al.

[11] Patent Number: 6,147,524
[45] Date of Patent: Nov. 14, 2000

[54] INVERTER DEVICE DRIVING METHOD

[75] Inventors: Hidefumi Ueda; Masaichi Kudo, both of Kitakyushu, Japan

[73] Assignee: Kabushiki Kaisha Yaskawa Denki, Fukuoka, Japan

[21] Appl. No.: 09/230,835
[22] PCT Filed: Aug. 4, 1997
[86] PCT No.: PCT/JP97/02707
 § 371 Date: Mar. 17, 1999
 § 102(e) Date: Mar. 17, 1999
[87] PCT Pub. No.: WO98/07229
 PCT Pub. Date: Feb. 19, 1998

[30] Foreign Application Priority Data

Aug. 8, 1996 [JP] Japan ................................ 8-210171

[51] Int. Cl.$^7$ ............................. H03B 1/00; H03K 17/687
[52] U.S. Cl. ............................................ 327/112; 327/427
[58] Field of Search ..................... 327/108, 111, 327/112, 427, 434, 437

[56] References Cited

U.S. PATENT DOCUMENTS 5,543,740  8/1996  Wong ........................................ 327/108
5,963,066  10/1999  Fukunaga ................................ 327/112

*Primary Examiner*—Toan Tran
*Attorney, Agent, or Firm*—Jordan and Hamburg LLP

[57] ABSTRACT

In an inverter driving method, a method of completing an initial charging of a capacitor without damaging an upper arm-side semiconductor switching element, even when ON-signal latch thereof occurs during the initial capacitor charging period, is provided. The method applies to driving an inverter having an output unit in which at least one circuit of a serial connection, which comprises a pair of series-connected and complementarily ON-OFF driven semiconductor switching elements that are connected between positive and negative poles of a first DC power source. In this method, the initial charging of a capacitor at the inverter starting time is done by driving the series-connected semiconductor switching elements using alternately repeating short-time ON-OFF operations.

13 Claims, 5 Drawing Sheets

FIG. 5
(a)
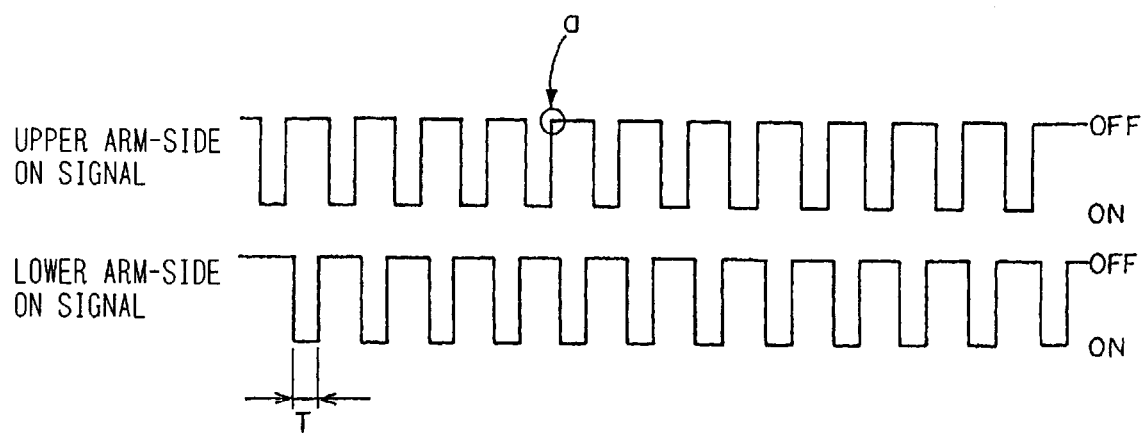
(b)
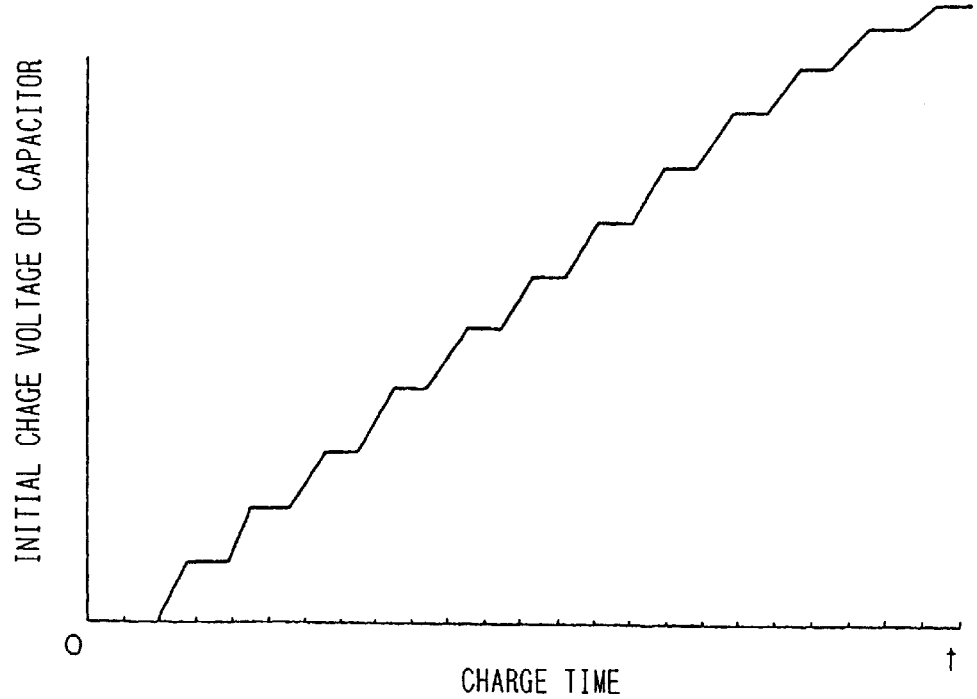

FIG. 6
(a)
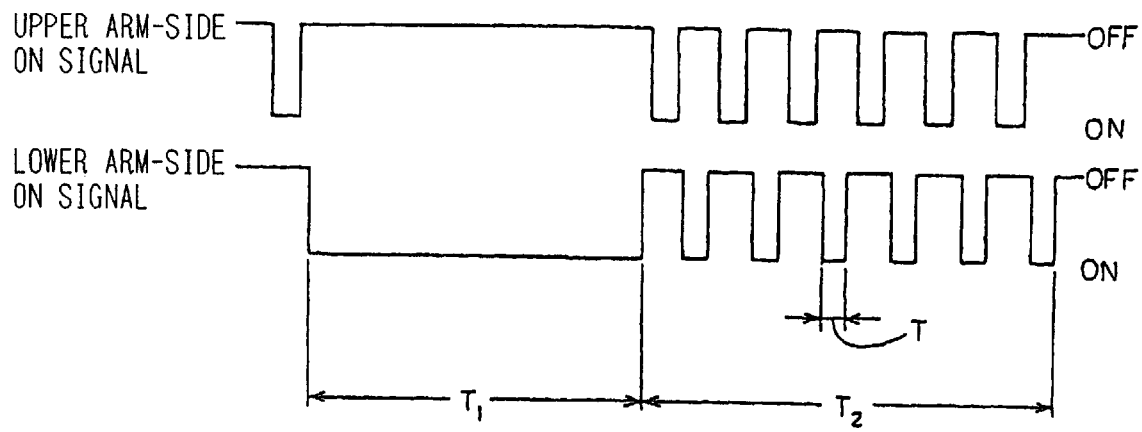
(b)
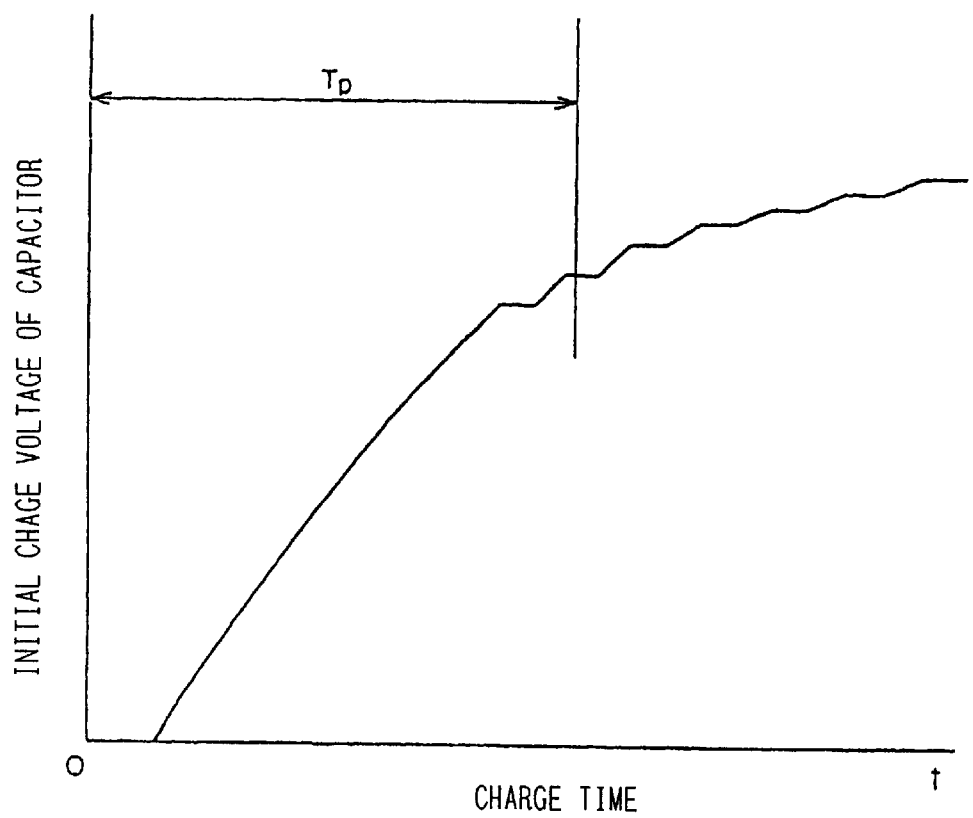

INVERTER DEVICE DRIVING METHOD

BACKGROUND OF THE INVENTION

The present invention relates to a method for driving an inverter device.

FIG. 1 is a diagram showing a prior known drive circuit of an inverter circuit, wherein this circuit is configured including a first direct current (DC) power supply 1, a upper semiconductor switching element 2 connected to a positive polarity side of the first DC power supply 1, a second drive circuit 4 for turn-on/off drive of the upper switching element 2, and a capacitor 7 for supplying a drive voltage to the drive circuit 4 when this capacitor 7 is charged. This circuit configuration is generally known as the "bootstrap" circuit. During the turn-on period of a lower semiconductor switching element 3 connected to a negative polarity side of the first DC power supply 1, a voltage at an output terminal of FIG. 1 becomes substantially equal to a voltage on the negative side of the first DC power supply 1 so that a circuit for charging and supplying electrical charge to the capacitor 7 from a second DC power supply 6, which is a drive power supply of a first drive circuit 5 for on/off-driving the lower semiconductor switching element 3 connected to the negative polarity side, is provided via a route indicated by dotted line portions in FIG. 1.

The final charge-up voltage being charged by this circuit at the capacitor 7 becomes nearly equal to the voltage of the second DC power supply 6 thereby enabling this capacitor 7 to be directly used as a drive power supply of the second drive circuit 4 which causes the upper semiconductor switching element 2 coupled to the positive polarity side to turn on and off.

Next, one exemplary prior art in the aforementioned configuration is shown in FIG. 2.

The circuit shown in FIG. 2 is designed such that a voltage monitoring circuit 9 is provided for monitoring a voltage between both terminals of the capacitor 7 while also providing an operation function of protecting the upper semiconductor switching element 2 by preventing turn-on of the upper semiconductor switching element 2 connected to the positive polarity side in cases where the capacitor 7 is low in voltage potential, thus eliminating thermal destruction or breakdown otherwise occurring due to turn-on of the upper semiconductor switching element 2 which operates in the state that the drive voltage is kept low in potential (Published Unexamined Japanese Patent Application or "PUJPA" No. 3-150075).

Incidentally, in most cases, it will hardly occur during normal operations that the charged voltage of the capacitor 7 in FIG. 2 becomes lower then a voltage value as set at the voltage monitoring circuit 9, except that this occurs exclusively at a specific time when the capacitor 7 undergoes an initial charge-up at the beginning of start-up of an inverter operation in the inverter device.

Under the features stated above, further in the inverter device, with regard to a means for transferring turn-on/off drive signals to an on/off drive circuit of an upper arm-side semiconductor switching element, another problem occurs in the case where the device employs an on/off signal edge transfer/latch scheme using a drive signal transfer section 12 for use with the upper arm-side semiconductor switching element which section contains therein a high breakdown voltage IC 11 as shown in FIG. 3, rather than continuous signal transfer schemes based on the turn-on/off of a photo-coupler that has been traditionally employed as electrical insulation means, as will be discussed below.

Upon startup of the inverter operation of the inverter device, a lower arm-side semiconductor switching element is typically held in the turn-on state continuously for along time period in order to increase the charge up speed of the capacitor 7. On the other hand, in view of the fact that the turn-on/off signal transmission of the upper arm-side semiconductor switching element follows the edge transfer/latch scheme, where the turn-on signal is accidentally latched during this initial charge up period due to malfunction of the upper arm-side semiconductor switching element drive signal transfer section 12, or alternatively due to externally applied "invasion" noises, both the upper and lower arm-side semiconductor switching elements turn on simultaneously resulting in the upper-and-lower electrical short-circuit state. At this time, since the voltage of the capacitor 7 stays low in potential in the midway of such initial charge up operation, the upper arm-side semiconductor switching element using this capacitor 7 as its drive power supply turns on due to deficiency of the drive voltage resulting in an operation in an unsaturated state, which in turn leads to unwanted concentration of heat loss which can cause damage or destruction. In addition, in the ease mentioned above, an over current detecting circuit 14 that is inherently provided for protection from the upper-and-lower short circuiting is limited in current because of operation in such an unsaturated state, and thus is unable to function in an expected way.

One possible approach to avoidance of this problem is to employ a prior art capacitor charge up monitoring circuit which is operable to prevent turn-on of the upper arm-side semiconductor switching element while the capacitor voltage remains low within the initial charge up time period to thereby eliminate latching of the turn-on signal. However, it will possibly happen that the setup voltage value of this voltage monitor circuit is slightly low in setup voltage in view of possible deviation in the manufacture thereof. If this is the case, latching of the turn-on signal of the upper arm-side semiconductor switching element can take place immediately after the capacitor charge up voltage goes beyond a preset voltage value $V_r$ of the voltage monitor circuit as shown in FIG. 4, thereby causing both the upper and lower arm-side semiconductor switching elements to turn on resulting in a current being suppressed at a level at which the over current defector circuit does not yet exhibit its intended function when the upper-and-lower short circuiting occurs. This in turn causes a problem of an inability to protect the upper arm-side semiconductor switching element. In FIG. 4 the reference character $V_o$ designates the voltage which enables the over current detector circuit to function, and $V_c$ denotes the final charge up voltage value of the capacitor. (A) indicates a time period in which the voltage monitoring circuit offers reliable protecting ability, that is, the period in which the over current detector circuit is incapable of protection; (B) is a time period in which the voltage monitor circuit does not offer reliable protection, namely, the period in which the over current detector circuit is incapable of protection; (C) is a period in which the over current circuit offers reliable protection, i.e., the period in which the voltage monitor circuit fails to offer reliable protection; and, (D) is a period in which the over current detector circuit offers reliable protection, i.e., the period in which the voltage monitor circuit cannot protect.

SUMMARY OF THE INVENTION

An object of the present invention is to complete an initial charge up of a bootstrap capacitor without allowing damage to an associated upper arm-side semiconductor switching element even upon occurrence of latching of a turn-on signal of such semiconductor switching element during the capacitor's initial charge up time period.

In order to attain the objective, an inverter device driving method in accordance with the present invention provides a method of driving an inverter device which has an output section including, between positive and negative polarities of a first DC power supply, at least one serial circuit formed of serially coupled upper and lower semiconductor switching elements driven to turn on and off in a complemental fashion, a first drive circuit for driving the lower semiconductor switching element connected to the negative polarity of the first DC power supply, a second drive circuit for driving the upper semiconductor switching element connected to the positive polarity side of the first DC power supply, a second DC power supply for supplying a semiconductor switching element driving voltage to the first drive circuit, a bootstrap capacitor, which is charged during the turn-on time period of the semiconductor switching element connected to the negative polarity side of the first DC power, supplies a semiconductor switching element driving voltage to the second drive circuit, the bootstrap capacitor being charged from the second DC power supply via the lower semiconductor switching element, a turn-on/off signal processing circuit operatively associated with the upper and lower semiconductor switching elements, and transfer means, including a high breakdown voltage IC, for transferring to the second drive circuit only turn-on/off signals, of those signals from the turn-on/off signal processing circuit, for the upper semiconductor switching element connected to the positive polarity side of the first DC power supply.

An operation of initial charge up of the bootstrap capacitor, upon starting of an inverter operation, is performed by operating the lower semiconductor switching element coupled to the negative polarity side of the first DC power supply to repeat a turn-on operation for a shortened time period of several µs to 30 µs including sequentially transferring a turn-on signal and a turn-off signal to the second drive circuit via an edge signal transfer means employing a high breakdown voltage IC prior to each turn-on operation of the short time.

In accordance with the present invention, there is an advantage that the initial charging of the capacitor can be completed without damaging the upper arm-side semiconductor switching element even where, during the initial charging of the capacitor that functions as the drive power supply of the upper arm-side semiconductor switching element, turn-on signal latch is generated in the on/off signal transfer section employing the high breakdown voltage IC due to either its erroneous operations or externally applied invasion noises to the drive circuit of the upper arm-side semiconductor switching element at the transfer section associated therewith.

BRIEF DESCRIPTION OF DRAWINGS

FIG. 5(a) is a waveform diagram of turn-on signals of the upper and lower-side semiconductor switching elements indicating a first embodiment of the present invention; end rig. 5(b) is an initial charge up voltage waveform diagram of a capacitor at an initial start-up time.

FIG. 6(a) is a waveform diagram of turn-on signals of the upper and lower-side semiconductor switching elements indicating a second embodiment of the present invention; end rig. 6(b) is an initial charge up voltage waveform diagram of a capacitor at that time.

DETAILED DESCRIPTION

Figure 1:
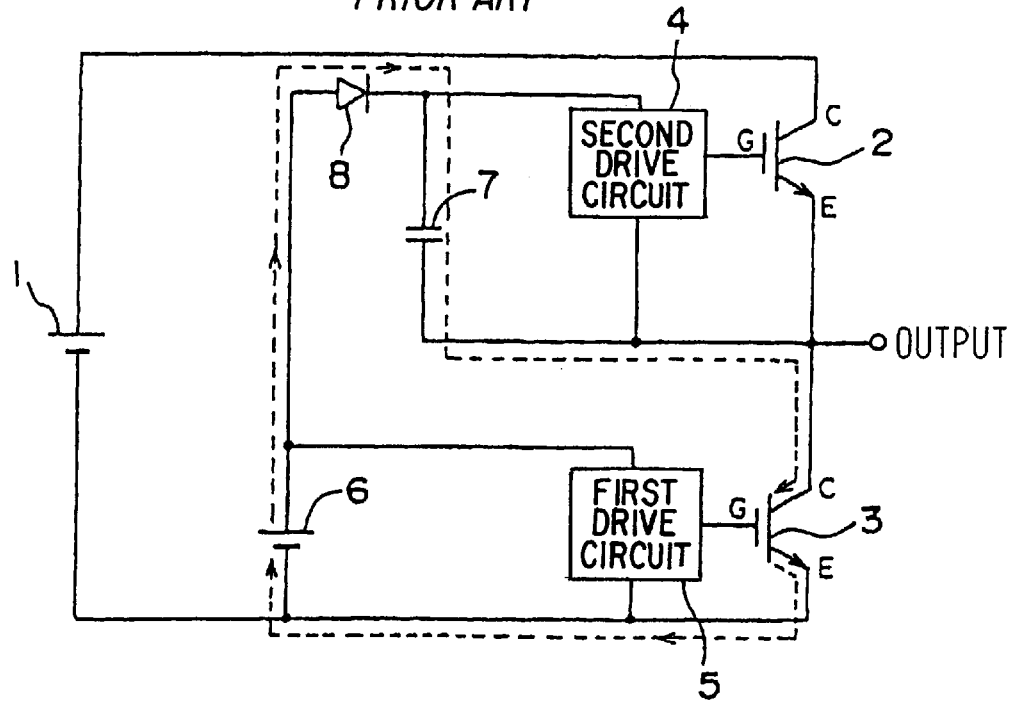
FIG. 1 is a circuit diagram showing one prior art method of charging by a bootstrap circuit a capacitor used as a drive power supply of an upper arm-side semiconductor switching element.
Figure 2:
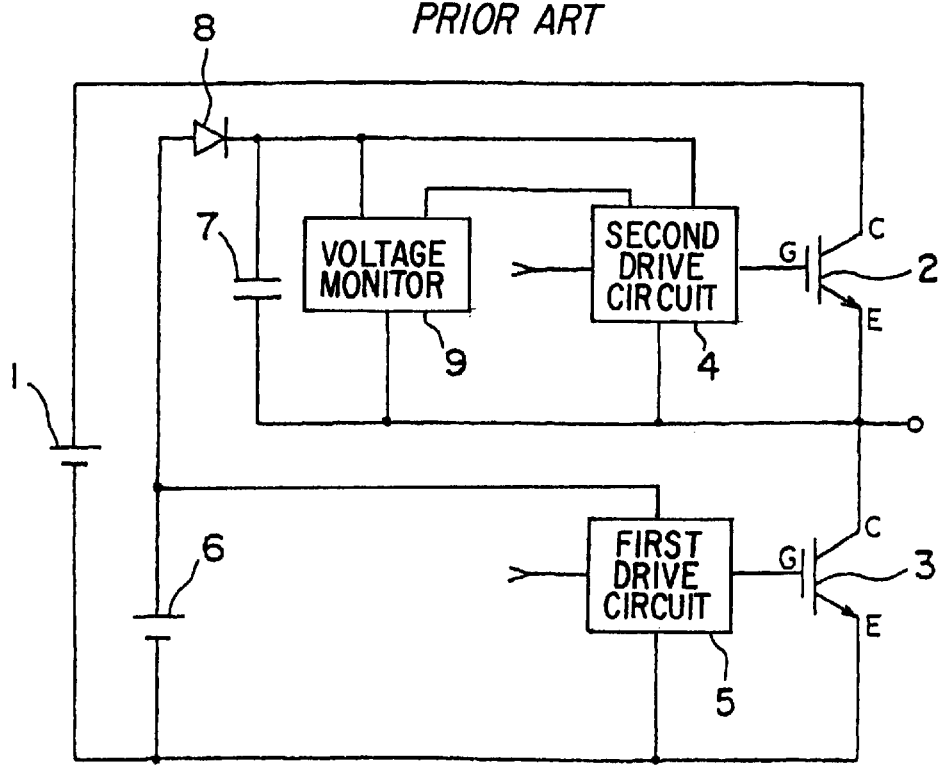
FIG. 2 is a circuit diagram showing one example of the prior art which employs, in the bootstrap circuit, a capacitor charge up voltage monitoring circuit.
Figure 3:
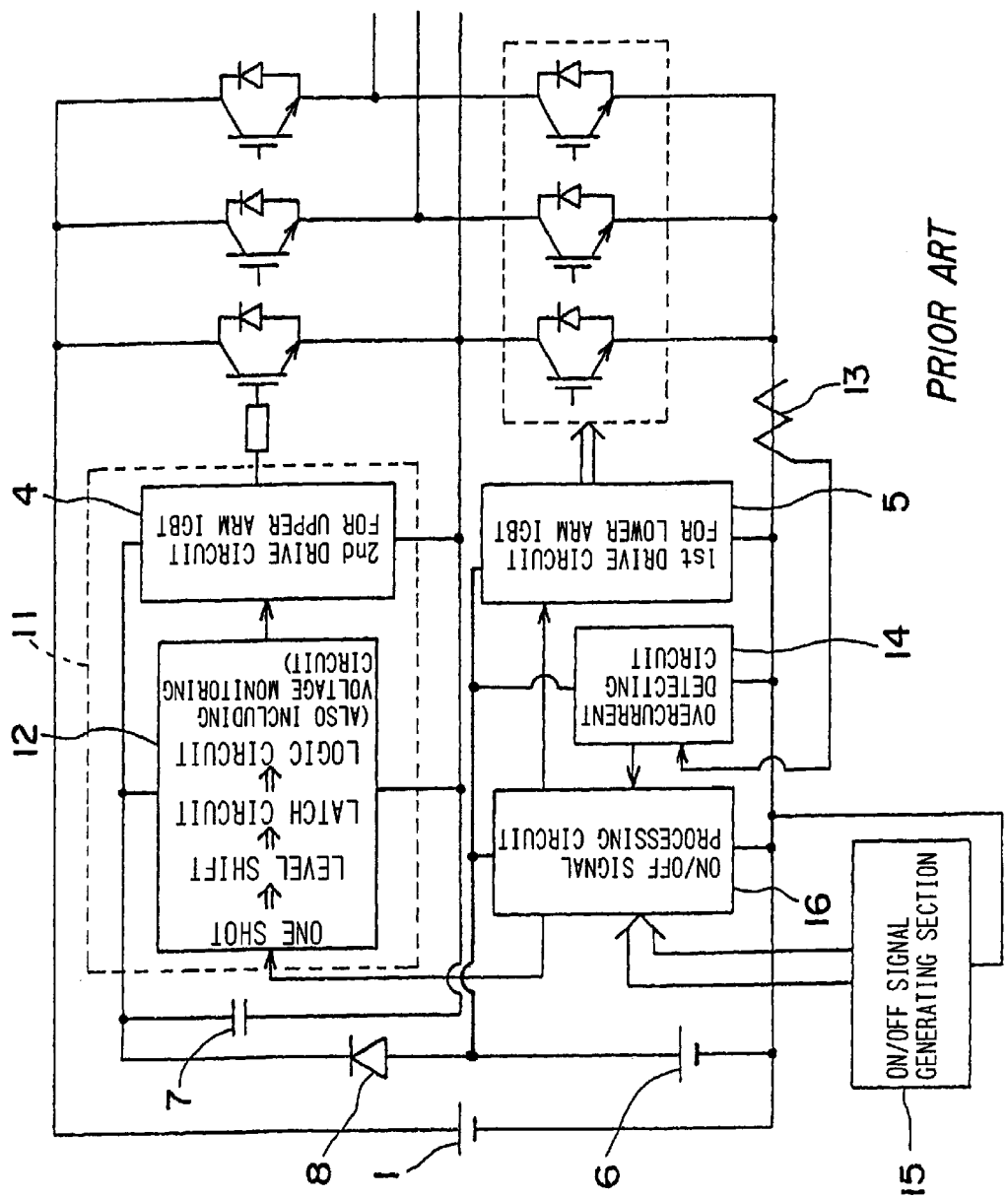
FIG. 3 is a block diagram in the case of a bootstrap circuit which is implemented so that the turn-on/off signal transmission to the upper arm-side semiconductor switching element is in a specified signal transmission scheme using a high breakdown voltage IC.
Figure 4:
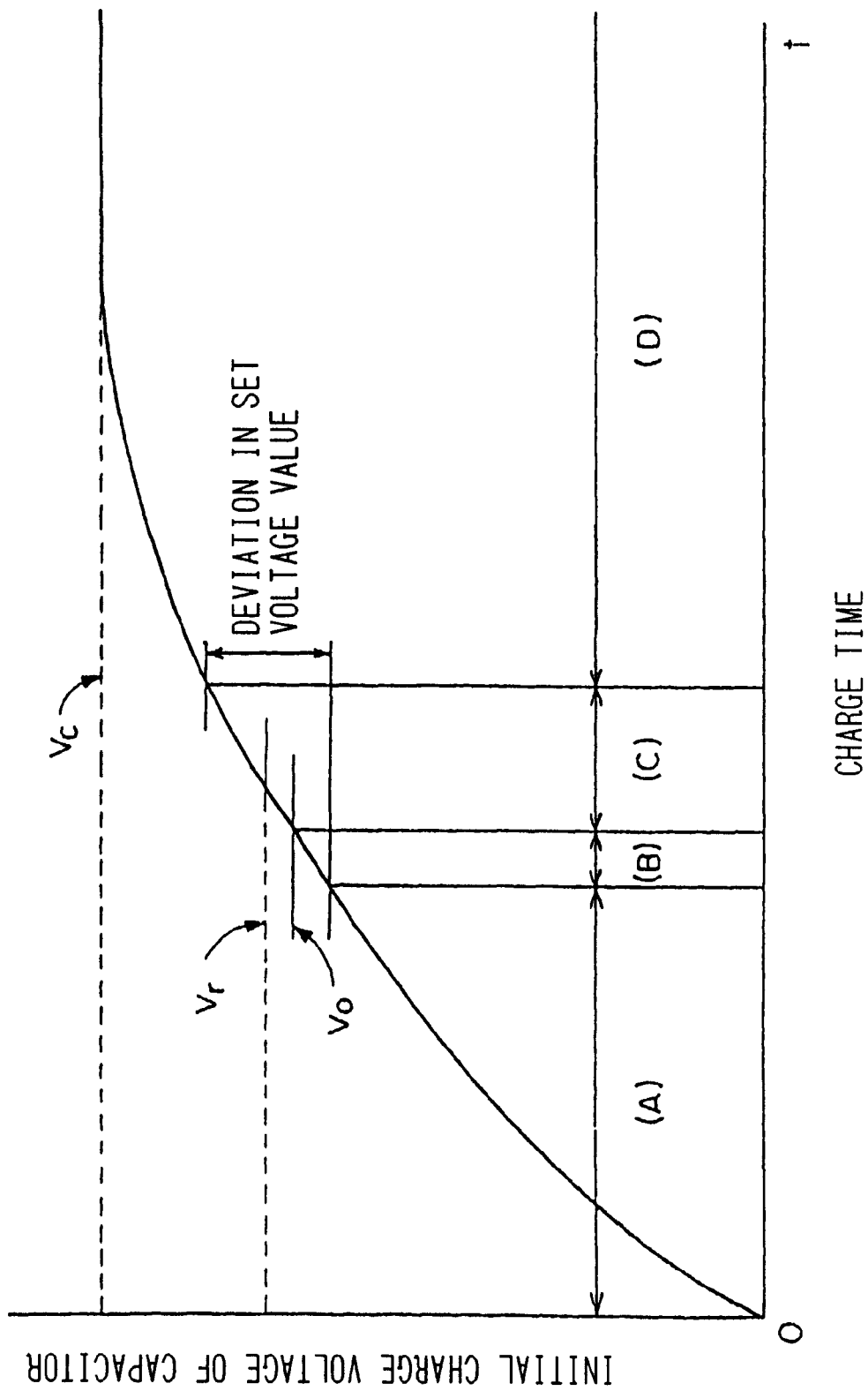
FIG. 4 is a graph illustrating problems faced with the circuit scheme of FIG. 3.

In the present invention, in the case where an upper arm-side semiconductor switching element is in a turn-on signal latch state, it will be required, in order to remove this state, that a turn-off signal be transferred to an upper arm-aide semiconductor switching element driving circuit. Referring to FIG. 3, the "off" signal transfer may be achieved by sending forth the turn-on and off signals to a turn-on/off signal processing circuit 16 shown in FIG. 3 once from an on/off signal generating section 15 in FIG. 3, to produce edge triggering by drive signals sent to the upper arm-side semiconductor switching element in the order of sequence of ON to OFF. When the signal changes from ON to OFF, the edge transfer is executed allowing the turn-off signal to be sent to an upper arm-side semiconductor switching element drive signal transfer section 12, thereby releasing the turn-on signal's latch state.

The present invention is such that an initial charging of a bootstrap capacitor 7, which acts as the upper arm-side semiconductor switching element driving power supply, is carried out while recurrently performing the above-mentioned operation in a shortened time period thus making any upper-and-lower short circuiting, which can occur within the turn-on period of the lower arm-side semiconductor switching element used for charging the capacitor 7 due to latching of the turn-on signal of the upper arm-side semiconductor switching element, short in length during this turn-on period to thereby make it possible to terminate the upper-and-lower short circuiting because of the fact that the lower arm-side semiconductor switching element turns off prior to destruction or breakdown of the upper arm-side semiconductor switching element. Next, the ON OFF signals of short time duration are transferred to the upper arm-side semiconductor switching element thus enabling removal of the turn-on signal latch in the manner stated above. Thereafter, although the lower arm-side semiconductor switching element turns on again for charging, the turn-on signal latch has already been removed at this time so that the upper-and-lower short circuiting will no longer take place to ensure that charge up of the capacitor can be continued without damaging the upper arm-side semiconductor switching element.

In this way, in accordance with the present invention, even where the on-signal latch occurs at any time during initial charging of the capacitor, it is possible to continue the initial charging of the capacitor to completion without damaging the upper arm-side semiconductor switching element.

A first embodiment of the present invention is hereafter explained referring to FIG. 5.

In a driver device of an inverter device with a configuration of FIG. 3, at the time of an instruction to startup inverter operation, a turn-on/off signal generating section 15, with an arithmetic processor device, operates to generate and issue control signals for making the upper and lower arm-side semiconductor switching elements turn on and off alternately for a short time, as shown in FIG. 5(a), only during a preset time period for initial charging of a bootstrap capacitor 7 which acts as the upper arm-side semiconductor switching element driving power supply. These on/off signals are transferred in such a way that one of them is transferred to the lower arm-side semiconductor switching element through a turn-on/off signal processing circuit 16, and the remaining one is sent to the upper arm-side semiconductor switching element via the on/off signal processing circuit 16 and an upper arm-side semiconductor switching element driving signal transfer section 12. Here, charging of the capacitor 7 is performed exclusively within limited short time periods in which the lower arm-side semiconductor switching element turns on (a preset on-time T at an on/off signal generating section 15: a few $\mu$s to 30 $\mu$s ) as shown in FIG. 5(a).

In cases where on-signal latch takes place due to malfunction of the upper arm-side semiconductor switching element driving signal transfer section 12, the upper-and-lower electrical short circuiting can occur during the turn-on period of the lower arm-side semiconductor switching element which charges the capacitor 7. However, this on-period is short so that the upper arm-side semiconductor switching element will no longer be damaged in any way. Further, the next on/off signal transmission to the upper arm-side semiconductor switching element driving signal transfer section 12 causes the on-signal latch be released or removed at a signal edge a upon startup of turn-off as shown in FIG. 5(a).

Thus, the on/off signal generating section 15 permits successful completion of the initial charging of the capacitor 7 through generation of a signal or signals for use in letting both of the upper and lower arm-side semiconductor switching elements turn on and off alternately for a short time only within the preset time period. After termination of this preset period, the on/off signal generating section 15 returns to the normal inverted operation.

Note that the semiconductor switching elements as used herein may also be applied to bipolar transistors, IGBTs, power MOS-FETs, and the like.

Referring to FIGS. 6(a) and 6(b), a second embodiment is arranged so that in the time period $T_p$, enabling establishment of reliable protection by a charge voltage monitoring circuit of the capacitor 7, upon an instruction to startup the inverter operation in the inverter device driving device with the circuit configuration of FIG. 3, the on/off signal generating section 15, with its arithmetic processor device, operates the lower arm-side semiconductor switching element to be continuously in the on state only during a preset time period $T_1$ as shown in FIG. 6(a). Further, in the next preset period $T_2$, the same is done as in the first embodiment. After termination of both periods $T_1$ and $T_2$, the on/off signal generating section 15 allows normal inverter operation. In FIG. 6(b), $T_p$ is the time period in which reliable protection is obtainable by the voltage monitoring circuit 9.

The present invention may be utilized in the field of inverters adaptable for use in driving electrical motors, illumination equipment and others.

What is claimed is:

1. A method for driving an inverter device including:
   an output section including at least one output switching series circuit having an output node, an upper arm switching element with an upper arm control input and first and second switch terminals, and a lower arm switching element with a lower arm control input, a first switch terminal serially connected at said output node to said second switch terminal of said upper arm switching element, and a second switch terminal;
   a first DC power supply for supplying power to said output switching series circuit, said first DC power supply having a first polarity output connected to said first switch terminal of said upper arm switching element and a second polarity output connected to said second switch terminal of said lower arm switching element;
   a first drive circuit driving said control input of said lower arm switching element;
   a second drive circuit driving said control input of said upper arm switching element;
   a second DC power supply for supplying voltage to said first drive circuit, said second DC power supply having a first polarity output and a second polarity output to which said first drive circuit is connected, said second polarity output being connected to said second polarity output of said first DC power supply;
   a capacitor for supplying voltage to said second drive circuit, said capacitor having a first terminal coupled to said first polarity output of said second DC power supply and a second terminal coupled to said output node such that during a turn-on time period of the lower arm switching element said second DC power supply charges said capacitor;
   a signal processing circuit for producing first drive signals for said first drive circuit and second drive signals for said second drive circuit in response to control signals directing switching of said upper and lower arm switching elements; and
   transfer means, including a high breakdown voltage IC, for transferring said second drive signals to said second drive circuit;

the method comprising the steps of:
   sending first control signals to said signal processing circuit to control said signal processing circuit to produce first drive signals to repeatedly turn ON and OFF said lower arm switching element to effect initial charging of said capacitor such that ON time periods are limited to be in the range of several $\mu$s to 30 $\mu$s; and
   sending second control signals to said signal processing circuit to control said signal processing circuit to produce second drive signals for controlling said second drive circuit to turn ON said upper arm switching element when said lower arm switching element is turned OFF and to turn OFF said upper arm switching element during said ON time periods of said lower arm switching element during said initial charging of said capacitor.

2. The method of claim 1 wherein said capacitor is coupled to said first polarity output of said second DC power supply via a diode for preventing discharge of said capacitor.

3. A method for driving an inverter device which includes:
   an output section including at least one output switching series circuit having an output node, an upper arm switching element with an upper arm control input and first and second switch terminals, and a lower arm switching element with a lower arm control input, a first switch terminal serially connected at said output node to said second switch terminal of said upper arm switching element, and a second switch terminal;

a first DC power supply for supplying power to said output switching series circuit, said first DC power supply having a first polarity output connected to said first switch terminal of said upper arm switching element and a second polarity output connected to said second switch terminal of said lower arm switching element;

a first drive circuit driving said control input of said lower arm switching element;

a second drive circuit driving said control input of said upper arm switching element;

a second DC power supply for supplying voltage to said first drive circuit, said second DC power supply having a first polarity output and a second polarity output to which said first drive circuit is connected, said second polarity output being connected to said second polarity output of said first DC power supply; and a capacitor for supplying voltage to said second drive circuit, said capacitor having a first terminal coupled to said first polarity output of said second DC power supply and a second terminal coupled to said output node such that during a turn-on time period of the lower arm switching element said second DC power supply charges said capacitor;

the method comprising the steps of:

sending first drive signals to said first drive circuit to repeatedly turn ON and OFF said lower arm switching element to effect initial charging of said capacitor such that ON time periods are limited to be less than a time required to damage said upper arm switching element if both said upper arm switching element and said lower arm switching element are turned on simultaneously; and sending second drive signals to turn OFF said upper arm switching element during said ON time periods of said lower arm switching element during said initial charging of said capacitor.

4. The method of claim 3 further comprising the step of sending second driving signals for controlling said second drive circuit to turn ON said upper arm switching element when said lower arm switching element is turned OFF during said initial charging of said capacitor, followed by said sending said second drive signals to turn OFF said upper arm switching element during said ON time periods of said lower arm switching element.

5. The method of claim 4 wherein said ON time periods of said lower arm switching element, during said initial charging of said capacitor, are limited to be in the range of several $\mu$s to 30 $\mu$s.

6. The method of claim 3 wherein said ON time periods of said lower arm switching element, during said initial charging of said capacitor, are limited to be in the range of several $\mu$s to 30 $\mu$s.

7. The method of claim 3 further comprising the step of providing a signal processing circuit for producing said first drive signals for said first drive circuit and said second drive signals for said second drive circuit in response to control signals directing switching of said upper and lower arm switching elements.

8. The method of claim 7 further comprising the step of providing transfer means, including a high breakdown voltage IC, for transferring said second drive signals to said second drive circuit.

9. The method of claim 3 further comprising the step of providing a signal generating apparatus for generating said first and second drive signals.

10. The method of claim 4 further comprising the step of providing a signal generating apparatus for generating said first and second drive signals.

11. The method of claim 5 further comprising the step of providing a signal generating apparatus for generating said first and second drive signals.

12. The method of claim 6 further comprising the step of providing a signal generating apparatus for generating said first and second drive signals.

13. The method of claim 3 wherein said capacitor is coupled to said first polarity output of said second DC power supply via a diode for preventing discharge of said capacitor.

* * * * *